(12) United States Patent
Knopik

(10) Patent No.: US 7,643,808 B2
(45) Date of Patent: Jan. 5, 2010

(54) DEVICE AND METHOD FOR MIXING CIRCUITS

(75) Inventor: Vincent Knopik, St Nazaire les Eymes (FR)

(73) Assignee: STMicroelectronics S.A., Montrouge (FR)

( * ) Notice: Subject to any disclaimer, the term of this patent is extended or adjusted under 35 U.S.C. 154(b) by 597 days.

(21) Appl. No.: 11/481,240

(22) Filed: Jul. 5, 2006

(65) Prior Publication Data

US 2007/0018507 A1 Jan. 25, 2007

(30) Foreign Application Priority Data

Jul. 5, 2005 (FR) .................................. 05 07168

(51) Int. Cl.
*H04B 1/18* (2006.01)
(52) U.S. Cl. .................. 455/189.1; 455/190.1; 455/293
(58) Field of Classification Search ................. 455/293, 455/189.1, 326, 23, 42, 130, 205, 196.1, 455/190.1
See application file for complete search history.

(56) References Cited

U.S. PATENT DOCUMENTS

| | | | | |
|---|---|---|---|---|
| 4,727,597 | A | * | 2/1988 | Dautriche .................... 455/333 |
| 5,694,069 | A | * | 12/1997 | Kasashima et al. .......... 327/179 |
| 7,432,765 | B2 | * | 10/2008 | Kojima ....................... 330/283 |

OTHER PUBLICATIONS

Barnes, et al., "A comparison of W-band monolithic resistive mixer architectures," 2002 IEEE MTT-S International Microwave Symposium Digest, (IMS 2002), Seattle, WA, Jun. 2-7, 2002, IEEE MTT-S International Microwave Symposium, New York, NY; IEEE, US, vol. 3 of 3, Jun. 2, 2002, pp. 1867-1870; XP001113968; ISBN: 0-7803-7239-5.

Megej, et al., "Fully Monolithically Integrated Wide-Band RF-Source," 31st European Microwave Conference Proceedings, London, Sep. 25-27, 2001, Proceedings of the European Microwave Conference, London; CMP, GB, vol. 1 of 3, Conf. 31. Sep. 25, 2001, pp. 125-128m; XP001044764; ISBN: 0-86213-148-0.

Kashiwa, et al., "A V-band Drain Injected/Resistive Dual-Mode Monolithic Mixer," GAAS IC Symposium, 1999, 21st Annual, Monterey, California, USA, Oct. 17-20, 1999, Piscataway, New Jersey, US, IEEE, US, Oct. 27, 1999, pp. 117-120; XP010359201; ISBN: 0-7803-5585-7.

Preliminary French Search Report, FR 05 07168, dated Apr. 21, 2006.

* cited by examiner

*Primary Examiner*—Sonny Trinh
(74) *Attorney, Agent, or Firm*—Gardere Wynne Sewell LLP

(57) ABSTRACT

A first and a second signal (base band and local oscillator), respectively modulated to a first and a second frequency, are mixed to deliver an output signal at a frequency obtained by combining the first and second frequencies. The mixing is accomplished through a variable resistance stage controlled by the second signal and connected between a first and a second potential to deliver the mixed output signal. A control stage is configured to drive the resistance variation of the variable resistance stage according to the first signal.

21 Claims, 2 Drawing Sheets

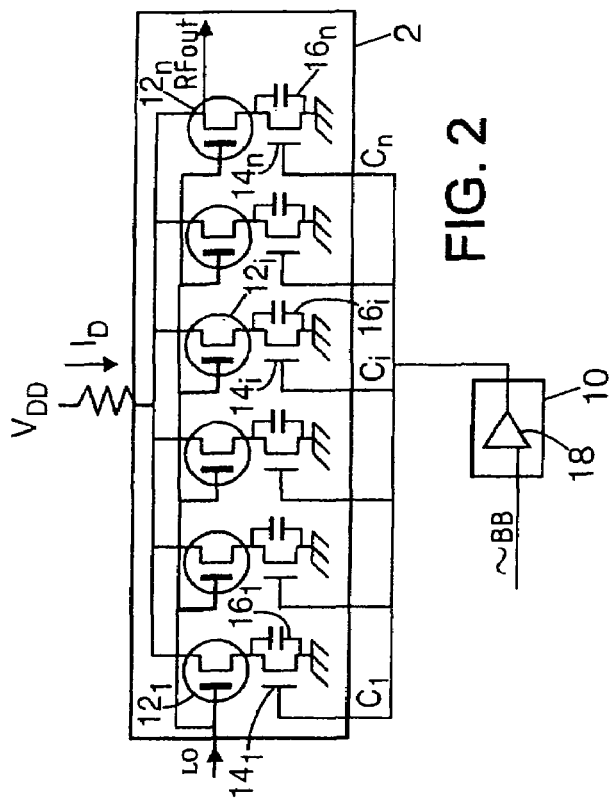
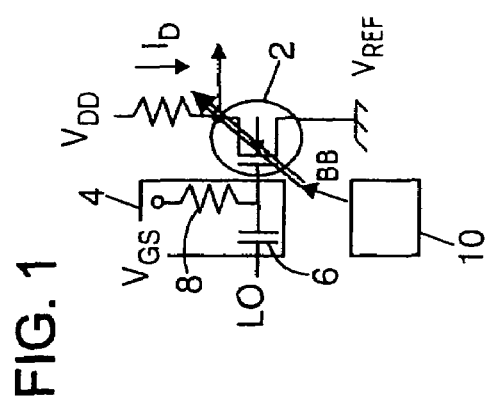
FIG. 1
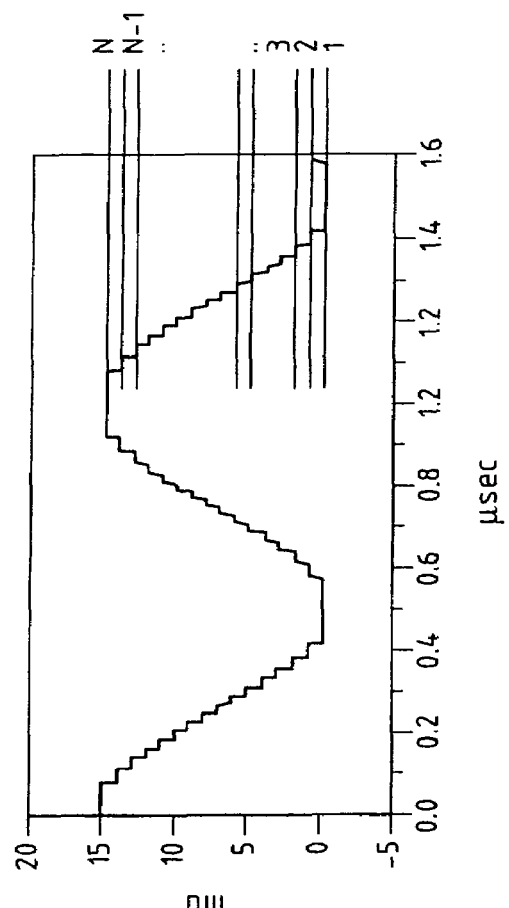
FIG. 2
FIG. 3

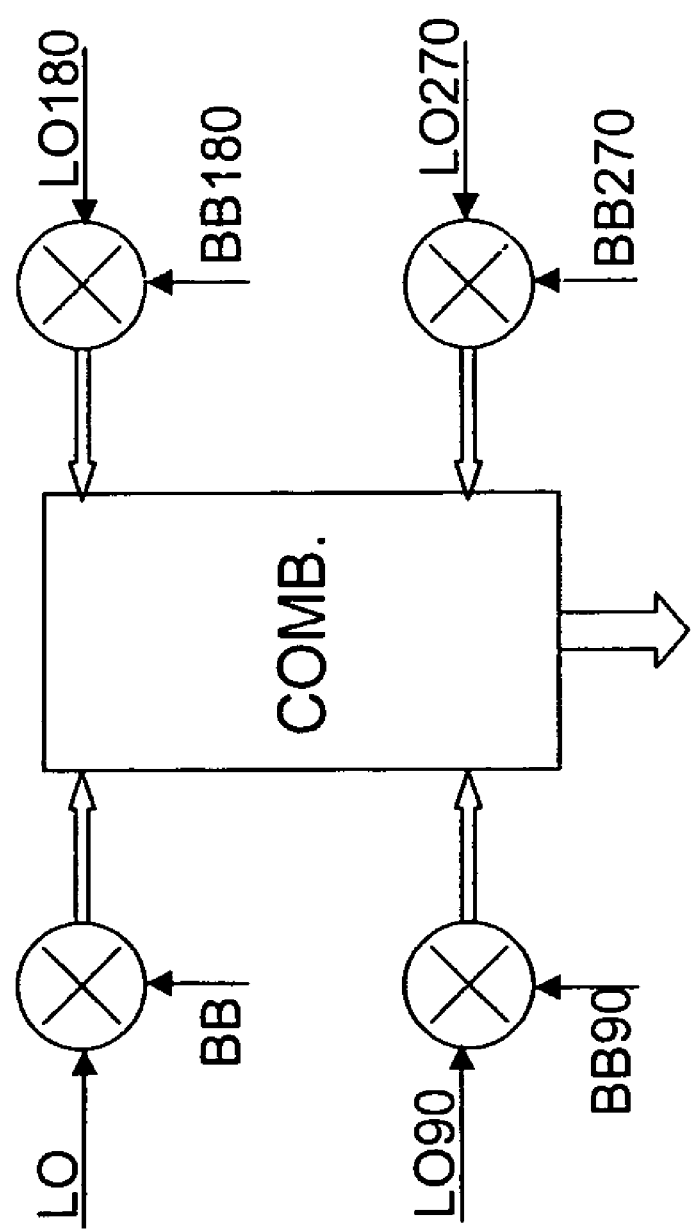

DEVICE AND METHOD FOR MIXING CIRCUITS

PRIORITY CLAIM

The present application claims priority from French Patent Application No. 05 07168 filed Jul. 5, 2005, the disclosure of which is hereby incorporated by reference.

BACKGROUND OF THE INVENTION

1. Technical Field of the Invention

The present invention relates to mixing of frequency-modulated signals to deliver an output signal at a frequency obtained by combining the frequencies of the first and second signals.

2. Description of Related Art

Known mixing devices use two variable resistance stages, connected in series between a power supply voltage and a reference voltage, the resistance variation of each stage being controlled by one of the two signals to be mixed.

Conventionally, each of these two stages is implemented in the form of two cascoded transistors, the variations of the input signals causing variations of the current flowing in the transistors. All the transistors conduct one of the signals to be mixed, such that they must each satisfy strict operating requirements.

In particular, in order to reduce the area of circuit used and the consumption of electrical energy, these transistors present a high internal resistance and need to operate at high frequencies with low voltages. Consequently, these transistors present a high voltage swing at their terminals, which reduces the useful power available on the output signal.

However, in numerous applications, such as telecommunications, it is essential to have a predetermined output power.

Consequently, there is a problem concerning power available at the output of the existing mixing devices.

There is accordingly a need to resolve this problem by means of a mixing device suitable for delivering a higher output power level.

SUMMARY OF THE INVENTION

To this end, an embodiment of the present invention is a device for mixing a first and a second signal, respectively modulated to a first and a second frequency, to deliver an output signal at a frequency obtained by combining the first and second frequencies. The device includes a variable resistance stage controlled by the second signal and designed to be connected between a first and a second potential to deliver the output signal. A control stage is configured also to drive the resistance variation of the variable resistance stage according to the first signal.

Another subject of the invention is a method of mixing a first and a second signal respectively modulated to a first and a second frequency to deliver an output signal at a frequency obtained by combining the first and second frequencies, including: variation of the resistance, according to the second signal, of a variable resistance stage intended to be connected between a first and a second potential; and variation of the resistance of this variable resistance stage also according to the first signal.

Because only one variable resistance stage is used, the device according to the invention presents a lower voltage swing, which provides for a greater power available for the output signal level.

In an embodiment, a circuit comprises a variable resistance stage coupled between first and second reference voltages and formed of a plurality of first transistors and plurality of second transistors, each first transistor connected in series to a second transistor, wherein the gates of the plurality of first transistors receive a local oscillator signal and the gates of the second transistors receive a digital control signal. A control stage receives a base band signal and generates therefrom the digital control signal which is applied to the gates of the second transistors, with a mixed signal being output from a commonly connected conduction terminal of the plurality of first transistors.

In another embodiment, a circuit comprises a first and second transistor gate connected together to receive an input local oscillator signal and source or drain connected together to output a mixed signal. A first switch is connected in series with a source/drain circuit of the first transistor, and a second switch is connected in series with a source/drain circuit of the second transistor. A control circuit receives a base band signal and is operable responsive to the base band signal to generate first and second control signals applied to control actuation of the first and second switches, respectively.

BRIEF DESCRIPTION OF THE DRAWINGS

Other characteristics and advantages of the invention will become further apparent on reading the description which follows. The latter is purely illustrative and should be read in conjunction with the appended drawings, in which:

FIG. 1 is a schematic diagram of a mixing device according to the invention;

FIG. 2 is a detailed diagram of a particular embodiment;

FIG. 3 represents the control signal of the device described with reference to FIG. 2; and FIG. 4 represents a schematic diagram of another embodiment of the invention.

DETAILED DESCRIPTION OF THE DRAWINGS

According to an embodiment of the invention represented in FIG. 1, the mixing device includes a variable resistance stage 2 intended to be connected between a power supply voltage denoted $V_{DD}$ via a load resistor wherein flows a current ID and a reference voltage denoted $V_{REF}$.

This mixing device is suitable for mixing a first low-frequency modulated signal $F_1$, also called baseband signal and denoted BB, and a second high-frequency modulated signal $F_2$, also called local oscillator signal and denoted LO. It delivers an output signal at a frequency obtained by combining the frequencies $F_1$ and $F_2$.

In the embodiment described, the variable resistance stage 2 includes a plurality of components forming a transistor of variable size, the variation of the size of this transistor constituting the resistance variation.

Advantageously, the device also includes a stage 4 for formatting the signal LO including a capacitor 6 and a resistor 8 for biasing the stage 2 or any biasing device providing these functions. Advantageously, the formatting stage 4 also includes a device for controlling the gain of the signal LO.

Moreover, the device includes a control stage 10 suitable for controlling the variation of the resistance value of the variable resistance stage 2 at the frequency $F_1$ of the first signal BB. This control stage, in the embodiment described, affects the size of the transistor forming the stage 2.

Consequently, the output of the device depends on the second signal LO at the frequency $F_2$ and also the first signal BB at the frequency $F_1$. In practice, the resistance of the stage 2 depends on the signal LO which affects the current circulating in the transistor and the signal BB which affects the size of this transistor. Consequently, the output signal varies according to the two frequencies $F_1$ and $F_2$ and forms a mixing product.

The use of a single variable resistance stage 2 limits the voltage swing to which the power supply voltage $V_{DD}$ is subject, such that a high power is available on the output signal.

FIG. 2 describes the detail of an embodiment of the device of FIG. 1.

In this embodiment, the variable resistance stage 2 includes a plurality of transistors $12_1$ to $12_n$ mounted in parallel. Each transistor $12_i$ receives as input the second signal LO and is connected in series between the power supply voltage $V_{DD}$ and the reference voltage $V_{REF}$ through switches $14_1$ to $14_n$. The switches $14_i$ are controlled individually or as a group by the control stage 10.

In this embodiment, the number of switches $14_i$ that are ON determines the overall size of the equivalent transistor formed by the set of these transistors $12_i$ and therefore the resistance of the stage 2.

In practice, when one of the switches $14_i$ is ON, the corresponding transistor which is mounted in series between the power supply voltage $V_{DD}$ and the reference voltage $V_{REF}$, is conducting. Conversely, when the transistor $14_i$ is OFF, the corresponding transistor $12_i$ is no longer operating, which increases the resistance of the stage 2.

For example, the switches $14_i$ are formed by transistors, such that each set formed by a transistor $12_i$ and a transistor $14_i$ constitutes a so-called cascode assembly. However, the transistors $14_i$ do not directly carry the signal to be mixed and operate only as control switches. Consequently, they do not need to satisfy the same requirements as the transistors $12_i$ and can be formed by large-size components and present a low internal resistance and therefore a low voltage swing at their terminals to retain a maximum of power at the output.

In the embodiment described, the control stage 10 receives as input the signal BB at the frequency $F_1$, in the form of an analog signal, and delivers as output a plurality of control signals $C_1$ to $C_n$ intended respectively for the switches $14_1$ to $14_n$.

Furthermore, in the embodiment described, each transistor $14_i$ is mounted in parallel with a capacitor $16_i$. The use of the capacitors $16_i$ also makes it possible to filter a leak of the signal LO or any other unwanted frequency on the switch transistor $14_i$ by acting as a radiofrequency ground.

In the example, the stage 10 includes a multiple-threshold comparator 18, with the overshoot of the thresholds by the signal BB causing the switches $14_i$ to be controlled as is shown in FIG. 3.

In this figure, the signal BB is represented in the form of a staircase signal corresponding to the output of the comparator 18, each tread causing a switch to be switched. The switches can also be controlled digitally using a DSP or an analog output converted to digital.

This mixing device can be used to implement a method of mixing the first and the second signals BB and LO, respectively modulated to a first and a second frequency $F_1$ and $F_2$, to deliver an output signal at a frequency obtained by combining the first and second frequencies $F_1$ and $F_2$.

This method includes: the introduction of the second signal LO at the input of the variable resistance stage 2, intended to be connected between a first and a second potential $V_{REF}$ and $V_{DD}$; and the variation of the resistance of this variable resistance stage 2 also according to the first frequency $F_1$ of the first signal BB.

More specifically, in the case where the variable resistance stage 2 includes a plurality of transistors $12_i$ mounted in parallel, each receiving as input the second signal LO and being intended to be connected between the first and second potentials $V_{DD}$ and $V_{REF}$ in series with a switch $14_i$, the method includes the individual or grouped control of these switches $14_i$ according to the frequency $F_1$ of the first signal BB.

Thus, the resistance variation of the stage 2 is controlled both by the frequency $F_2$ of the signal LO which influences the current flowing in the transistor and by the frequency $F_1$ of the signal BB which influences the size of the transistor.

Of course, other means of implementing the variable resistance stage 2 or the control stage 10 can be considered.

In particular, in the example, the frequency $F_1$ of the signal BB is below the frequency $F_2$ of the signal LO and other combinations can be envisaged.

Moreover, in other embodiments, a mixer includes a number of variable resistance stages such as those described previously. Each stage receives the same second signal LO with a predetermined phase shift and a combination stage receives the outputs so as to deliver a signal mainly presenting only a predetermined combination of the frequencies $F_1$ and $F_2$ by an appropriate combination of the output signals of the phase-shifted stages. The generation of such an output signal for combining staggered signals is implemented conventionally.

An example of such device using several resistance stages is represented with reference to FIG. 4. In this example, four stages are used, each of them receiving a signal with a 90° phase shift and providing an output signal to a combination unit.

It is also possible to use a number of variable resistance stages connected in parallel with each other, each delivering an output signal and all the output signals being added to each other. Such an assembly can thus be used to apply a steady-state gain to the output signal corresponding to the number of stages connected.

Such a mixing device can be incorporated in any kind of electronic circuit such as a tuner, a digital modulator or other. This device can be implemented in the form of custom circuits or even incorporated in another circuit including a number of functions. Such a circuit can in turn be part of an electronic appliance such as, for example, a mobile phone, a computer or an equivalent appliance.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A device for mixing a first baseband signal and a second local oscillator frequency signal, respectively modulated to a first and a second frequency, to deliver an output signal at a frequency obtained by combining the first and second frequencies, comprising:

a variable resistance stage receiving the second local oscillator frequency signal and connected between a first and a second potential to deliver the output signal;

a control stage configured to drive the resistance variation of the variable resistance stage according to the first baseband signal, the control stage generating a digitized control signal from the first baseband signal, that digitized control signal being applied to the variable resistance stage.

2. The device according to claim 1, wherein the first frequency is less than the second frequency.

3. The device according to claim 1, wherein the variable resistance stage is a variable size transistor, wherein the size of the transistor varies according to the digitized control signal generated from the first baseband signal.

4. The device according to claim 1, wherein the variable resistance stage comprises a plurality of switched transistors mounted in parallel, each switched transistor adapted to be selectively disabled in response to a magnitude of the first baseband digital signal so as to modify a steady-state gain of the device.

5. A device for mixing a first and a second signal, respectively modulated to a first and a second frequency, to deliver an output signal at a frequency obtained by combining the first and second frequencies, comprising:
   a variable resistance stage receiving the second signal and connected between a first and a second potential to deliver the output signal;
   a control stage configured to drive the resistance variation of the variable resistance stage according to the first signal;
   wherein the variable resistance stage is a transistor of first variable size, the size of which varies according to the first signal; and
   wherein the variable resistance stage includes a plurality of first transistors mounted in parallel, each receiving as input the second signal and being connected between the first and second potentials in series with a switch, these switches being switched individually or as a group by the control stage according to the first signal.

6. The device according to claim 5, wherein the control stage receives as input the first signal and includes a multiple-threshold comparison module, the overshoot of the thresholds by the first signal causing the switches to be switched.

7. The device according to claim 5, wherein the switches are second transistors cascoded with the first transistors that receive the second signal.

8. The device according to claim 5, wherein each switch is mounted in parallel with a capacitor.

9. The device according to claim 5, further including a stage for formatting the second signal positioned upstream of the variable resistance stage.

10. The device according to claim 9, wherein said stage for formatting the second signal includes a gain control device.

11. A device for mixing a first and a second signal, respectively modulated to a first and a second frequency, to deliver an output signal at a frequency obtained by combining the first and second frequencies, comprising:
    a variable resistance stage receiving the second signal and designed to be connected between a first and a second potential to deliver the output signal;
    a control stage configured to drive the resistance variation of the variable resistance stage according to the first signal; and
    further including a number of variable resistance stages, each receiving the second signal with a predetermined phase shift, and a combination stage receiving the outputs of each of said variable resistance stages to deliver an output signal from the device presenting a desired combination of the first and second frequencies.

12. An electronic circuit, including a mixing device comprising:
    a variable resistance stage controlled by a local oscillator signal and designed to be connected between a first and a second potential to deliver a mixed output signal;
    a control stage configured also to drive the resistance variation of the variable resistance stage according to a base band signal.

13. A circuit, comprising:
    a variable resistance stage coupled between first and second reference voltages and formed of a plurality of first transistors and plurality of second transistors, each first transistor connected in series to a second transistor, wherein the gates of the plurality of first transistors receive a local oscillator signal and the gates of the second transistors receive a digital control signal; and
    a control stage which receives a base band signal and generates therefrom the digital control signal which is applied to the gates of the second transistors, with a mixed signal being output from a commonly connected conduction terminal of the plurality of first transistors.

14. A method of mixing a first and a second signal, respectively modulated to a first and a second frequency, to deliver an output signal at a frequency obtained by combining the first and second frequencies, including:
    varying a resistance, according to the second signal, of a variable resistance stage connected between a first and a second potential; and
    varying of the resistance of this variable resistance stage also according to the first signal;
    wherein the variable resistance stage includes a plurality of transistors mounted in parallel, each receiving as input the second signal and being connected between the first and second potentials in series with a switch, the method further including individually controlling of these switches according to the first signal.

15. A method of mixing a first and a second signal, respectively modulated to a first and a second frequency, to deliver an output signal at a frequency obtained by combining the first and second frequencies, including:
    varying a resistance, according to the second signal, of a variable resistance stage connected between a first and a second potential; and
    varying of the resistance of this variable resistance stage also according to the first signal;
    wherein the variable resistance stage includes a plurality of transistors mounted in parallel, each receiving as input the second signal and being connected between the first and second potentials in series with a switch, the method including group controlling of these switches according to the first signal.

16. A method of mixing a first and a second signal, respectively modulated to a first and a second frequency, to deliver an output signal at a frequency obtained by combining the first and second frequencies, including:
    varying a resistance, according to the second signal, of a variable resistance stage connected between a first and a second potential; and
    varying of the resistance of this variable resistance stage also according to the first signal;
    further including providing a number of variable resistance stages, each receiving the second signal with a predetermined phase shift, and further including combining outputs of each of said variable resistance stages to deliver an output signal presenting a desired combination of the first and second frequencies.

17. A method of mixing a first and a second signal, respectively modulated to a first and a second frequency, to deliver an output signal at a frequency obtained by combining the first and second frequencies, including:

varying a resistance, according to the second signal, of a variable resistance stage connected between a first and a second potential; and varying of the resistance of this variable resistance stage also according to the first signal;

further including providing a number of variable resistance stages mounted in parallel, and further including selectively disabling the stages to modify a steady-state gain.

18. A circuit, comprising:

a first and second transistor gate connected together to receive an input local oscillator signal and source or drain connected together to output a mixed signal;

a first switch connected in series with a source/drain circuit of the first transistor;

a second switch connected in series with a source/drain circuit of the second transistor;

a control circuit receiving a base band signal and operable responsive to the base band signal to generate first and second control signals applied to control actuation of the first and second switches, respectively.

19. The circuit of claim 18 wherein the first and second switches are each a transistor whose gate receives one of the control signals.

20. The circuit of claim 19 further including a capacitor connected in parallel to each of the transistors forming the first and second switches.

21. The circuit of claim 18 further comprising a resistance connected between a first reference voltage and the source or drain connection of the first and second transistors and a second reference voltage connected to the first and second switches.

* * * * *

UNITED STATES PATENT AND TRADEMARK OFFICE
CERTIFICATE OF CORRECTION

| | | |
|---|---|---|
| PATENT NO. | : 7,643,808 B2 | Page 1 of 1 |
| APPLICATION NO. | : 11/481240 | |
| DATED | : January 5, 2010 | |
| INVENTOR(S) | : Vincent Knopik | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 781 days.

Signed and Sealed this

Sixteenth Day of November, 2010

David J. Kappos
*Director of the United States Patent and Trademark Office*